US005459017A

United States Patent [19]

Topel, Jr. et al.

[11] Patent Number: 5,459,017

[45] Date of Patent: Oct. 17, 1995

[54] BARRIER LAYER FOR LASER ABLATIVE IMAGING

[75] Inventors: Richard W. Topel, Jr., Rochester; Linda Kaszczuk, Webster, both of N.Y.

[73] Assignee: Eastman Kodak Company, Rochester, N.Y.

[21] Appl. No.: 321,282

[22] Filed: Oct. 11, 1994

Related U.S. Application Data

[63] Continuation-in-part of Ser. No. 99,970, Jul. 30, 1993, abandoned.

[51] Int. Cl.$^6$ .................................. G03C 5/16; G03F 7/36

[52] U.S. Cl. .......................... 430/269; 430/201; 430/271; 430/944; 430/945; 430/964; 503/227; 347/224

[58] Field of Search .................................... 430/201, 270, 430/271, 944, 945, 964, 269; 503/227; 346/76 L

[56] References Cited

U.S. PATENT DOCUMENTS

| | | | |
|---|---|---|---|
| 4,245,003 | 1/1981 | Oransky et al. | 428/323 |
| 4,973,572 | 11/1990 | DeBoer | 503/227 |
| 5,156,938 | 10/1992 | Foley et al. | 430/200 |
| 5,171,650 | 12/1992 | Ellis et al. | 430/20 |
| 5,182,186 | 1/1993 | Inagaki et al. | 430/270 |

FOREIGN PATENT DOCUMENTS 0498083 8/1992 European Pat. Off. .

*Primary Examiner*—Richard L. Schilling
*Attorney, Agent, or Firm*—Harold E. Cole

[57] ABSTRACT

A process of forming a single color, dye ablation image having an improved D-min comprising imagewise-heating by means of a laser, a dye-ablative recording element comprising a transparent support having thereon a dye layer comprising an image dye dispersed in a polymeric binder, the dye layer having an infrared-absorbing material associated therewith to absorb at a given wavelength of the laser used to expose the element, the image dye being substantially transparent in the infrared region of the electromagnetic spectrum and absorbs in the region of from about 300 to about 700 nm and does not have any substantial absorption at the wavelength of the laser used to expose the element, the laser exposure taking place through the dye side of the element, and removing the ablated image dye material to obtain the image in the dye-ablative recording element, wherein the element contains a substantially transparent, hydrophilic, organic or inorganic polymeric dye barrier layer between the support and the dye layer.

8 Claims, No Drawings

BARRIER LAYER FOR LASER ABLATIVE IMAGING

CROSS-REFERENCE TO RELATED APPLICATIONS

This is a continuation-in-part of application Ser. No. 08/099,970, filed Jul. 30, 1993, now abandoned.

This invention relates to the use of a barrier layer in a laser dye-ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission D-min density value serves as a measure of the completeness of image dye removal by the laser.

U.S. Pat. No. 4,973,572 relates to infrared-absorbing cyanine dyes used in laser-induced thermal dye transfer elements. In Example 3 of that patent, a positive image is obtained in the dye element by using an air stream to remove sublimed dye. However, there is no disclosure of the use of a dye barrier layer in the element in that process.

U.S. Pat. No. 5,171,650 relates to an ablation-transfer image recording process. In that process, an element is employed which contains a dynamic release layer (DRL) which absorbs imaging radiation which in turn is overcoated with an ablative carrier topcoat. An image is transferred to a receiver in contiguous registration therewith. The useful image obtained in this process is contained on the receiver element. There is no disclosure in that patent that the element should contain a transparent, hydrophilic, organic or inorganic polymeric dye barrier layer. Instead, the DRL layers disclosed are intrinsically absorbing or are sensitized to impart the necessary absorbance. Such a DRL layer would not ablate to provide a sufficiently low D-min for a transmission image.

U.S. Pat. No. 4,245,003 relates to a laser-imageable element comprising graphite particles in a binder. In that patent, however, exposure takes place through the support and a separate receiver is used to obtain the useful image. There is also no disclosure in that patent that the element should contain a hydrophilic dye barrier layer. It would be desirable provide a single sheet imaging process which does not require a separate receiver, which has low D-min, and which is not limited to graphite particles which can only produce a black image.

U.S. Pat. No. 5,156,938 relates to the use of certain sensitizers and a decomposable binder, such as low viscosity nitrocellulose, in a laser-absorbing coating in conjunction with a separate receiving element. However, there is no disclosure in that patent of a single-sheet process or that the element should contain a hydrophilic dye barrier layer in order to reduce D-min.

It is an object of this invention to provide a process for improving the D-min obtained in a dye-ablative recording element. It is another object of this invention to provide a single-sheet process which does not require a separate receiving element.

These and other objects are achieved in accordance with the invention which comprises a process of forming a single color, dye ablation image having an improved D-min comprising imagewise heating by means of a laser, a dye-ablative recording element comprising a transparent support having thereon a dye layer comprising an image dye dispersed in a polymeric binder, the dye layer having an infrared-absorbing material associated therewith to absorb at a given wavelength of the laser used to expose the element, the image dye being substantially transparent in the infrared region of the electromagnetic spectrum and absorbs in the region of from about 300 to about 700 nm and does not have any substantial absorption at the wavelength of the laser used to expose the element, the laser exposure taking place through the dye side of the element, and removing the ablated image dye material to obtain the image in the dye-ablative recording element, and wherein the element contains a substantially transparent, hydrophilic, organic or inorganic polymeric dye barrier layer between the support and the dye layer.

It has been found unexpectedly that use of a hydrophilic dye-barrier layer in the above dye-ablative recording element for laser ablative imaging significantly affects the desired dye cleanout as evidenced by the resulting faster writing speeds to achieve a given minimum density. Minimum densities of less than 0.10 are achieved in accordance with the invention.

The dye-barrier layer in this invention can be any material provided it is a hydrophilic, organic or inorganic polymer. For example, there may be employed metal alkoxides, clays, lignin, keratin, gelatin, polyamides, polyacrylamides, n-vinyl amides, vinyl alcohol polymers, polyimidazoles, perfluorinated polymers, acid-based polymers (i.e. maleic or fumaric), polyacrylics, siloxanes, cellulosics, ionomers, polyelectrolytes, or any blends or copolymers of the above. In a preferred embodiment of the invention, the hydrophilic dye-barrier layer is poly(vinyl alcohol), gelatin, an acrylamide polymer or a titanium alkoxide such as titanium tetra-n-butoxide (Tyzor TBT® sold by DuPont Corp.). While any concentration of hydrophilic dye-barrier layer may be employed which is effective for the intended purpose, good results have been obtained at concentrations of from about 0.01 to about 1.0 g/m$^2$.

The dye ablation process of this invention can be used to obtain medical images, reprographic masks, printing masks, etc. The image obtained can be a positive or a negative image.

Any polymeric material may be used as the binder in the recording element employed in the process of the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly-(styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly (vinyl benzal); or mixtures or copolymers thereof. The binder may be used at a coverage of from about 0.1 to about 5 g/m$^2$.

In a preferred embodiment, the polymeric binder used in the recording element employed in process of the invention has a polystyrene equivalent molecular weight of at least 100,000 as measured by size exclusion chromatography, as described in U.S. Pat. No. 5,330,876, the disclosure of which is hereby incorporated by reference.

In another preferred embodiment, the infrared-absorbing material employed in the recording element used in the invention is a dye which is employed in the image dye layer.

To obtain a laser-induced, dye ablative image using the process of the invention, a diode laser is preferably employed since it offers substantial advantages in terms of its small size, low cost, stability, reliability, ruggedness, and ease of modulation. In practice, before any laser can be used to heat a dye-ablative recording element, the element must contain an infrared-absorbing material, such as cyanine infrared-absorbing dyes as described in U.S. Pat. No. 4,973,572, or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. As noted above, the laser exposure in the process of the invention takes place through the dye side of the dye ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

As described above, the image dye in the dye ablative recording element is substantially transparent in the infrared region of the electromagnetic spectrum and absorbs in the region of from about 300 to about 700 nm and does not have substantial absorption at the wavelength of the laser used to expose the element. Thus, the image dye is a different material from the infrared-absorbing material used in the element to absorb the infrared radiation and provides visible and/or UV contrast at wavelengths other than the laser recording wavelengths.

Any dye can be used in the dye-ablative recording element employed in the invention provided it can be ablated by the action of the laser and has the characteristics described above. Especially good results have been obtained with dyes such as anthraquinone dyes, e.g., Sumikaron Violet RS® (product of Sumitomo Chemical Co., Ltd.), Dianix Fast Violet 3RFS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

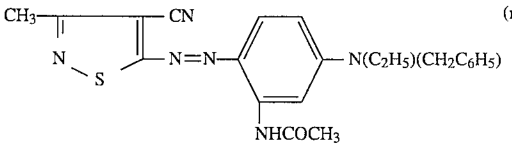

(magenta)

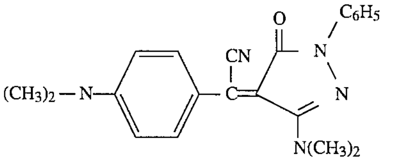

(magenta)

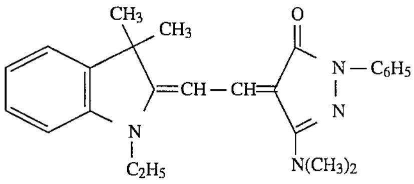

(yellow)

-continued (yellow)

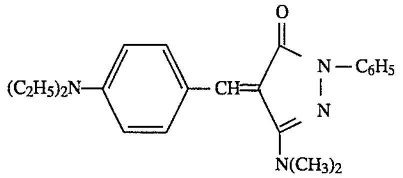

(cyan)

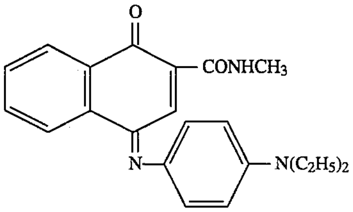

(cyan)

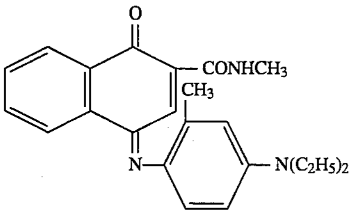

or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 g/m$^2$ and are preferably hydrophobic.

The dye layer of the dye-ablative recording element employed in the invention may be coated on the support or printed thereon by a printing technique such as a gravure process.

Any material can be used as the support for the dye-ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly(tetrafluoroethylene-cohexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

To evaluate the effect of a dye-barrier layer on D-min, samples were coated with the same dye combination with and without such a layer.

Element 1A) A monocolor dye ablative recording element according to the invention was prepared by coating on a 100 μm thick poly(ethylene terephthalate) support the following layers:

a) an acrylamide polymer, Cyanamer P-21®, (American Cyanamid Co.) coated at 0.54 g/m$^2$ from water; and b) a neutral dye formulation containing 0.52 g/m$^2$ of RS 1139 sec cellulose nitrate (Aqualon Co.), 0.18 g/m$^2$ IR-1 below, 0.30 g/m$^2$ C-1 below, 0.15 g/m$^2$ C- 2 below, 0.16 g/m$^2$ Y-1 below, and 0.26 g/m$^2$ M-1 below from acetone.

Element 1B) A monocolor dye ablative recording element according to the invention was prepared by coating on a 100 μm thick poly(ethylene terephthalate) support the following layers:

a) a layer of 96% hydrolyzed poly(vinyl alcohol) (Scientific Polymer Products, Inc.) coated at 0.54 g/m$^2$ from water; and b) a neutral dye formulation containing 0.52 g/m$^2$ of RS 1139 sec cellulose nitrate (Aqualon Co.), 0.18 g/m$^2$ IR-1 below, 0.30 g/m$^2$ C-1 below, 0.15 g/m$^2$ C- 2 below, 0.16 g/m$^2$ Y-1 below, and 0.26 g/m$^2$ M-1 below from acetone.

Element 1C) A monocolor dye ablative recording element according to the invention was prepared by coating on a 100 μm thick poly(ethylene terephthalate) support the following layers:

a) a layer of 88% hydrolyzed poly(vinyl alcohol) (Scientific Polymer Products, Inc.) coated at 0.54 g/m$^2$ from water; and b) a neutral dye formulation containing 0.52 g/m$^2$ of RS 1139 sec cellulose nitrate (Aqualon Co.), 0.18 g/m$^2$ IR-1 below, 0.30 g/m$^2$ C-1 below, 0.15 g/m$^2$ C- 2 below, 0.16 g/m$^2$ Y-1 below, and 0.26 g/m$^2$ M-1 below from acetone.

Control C-1 in this experiment was prepared similar to 1A except the barrier layer a) was omitted.

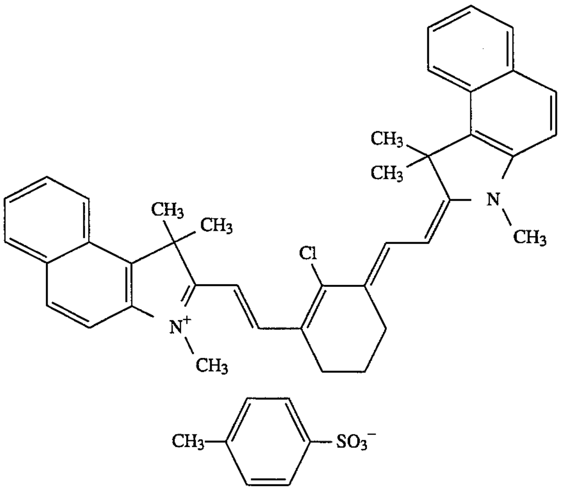

IR-1 Infrared-Absorbing Dye
C-1 Cyan Dye 1

(See second cyan dye illustrated above)

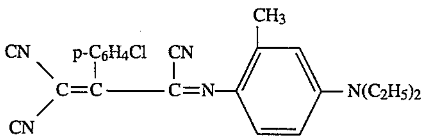

C-2 Cyan Dye 2
Y-1 Yellow Dye (See second yellow dye illustrated above)

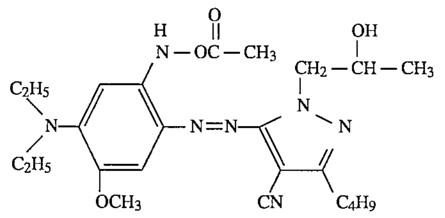

M-1 Magenta Dye

The recording elements were secured to the drum of a diode laser imaging device as described in U.S. Pat. No. 4,876,235 with the recording layer facing outwards. The laser imaging device consisted of a single diode laser connected to a lens assembly mounted on a translation stage and focused onto the surface of the laser ablative recording element. The diode lasers employed were Spectra Diode Labs No. SDL- 2430, having an integral, attached optical fiber for the output of the laser beam with a wavelength range 800–830 nm and a nominal power output of 250 milliwatts at the end of the optical fiber. The cleaved face of the optical fiber (50 μm core diameter) was imaged onto the plane of the dye-ablative element with a 0.5 magnification lens assembly mounted on a translation stage giving a nominal spot size of 25 μm.

The drum, 53 cm in circumference, was rotated at varying speeds and the imaging electronics were activated to provide exposures at 827 mJ/cm$^2$ or 621 mJ/cm$^2$. The translation stage was incrementally advanced across the dye-ablative element by means of a lead screw turned by a microstepping motor, to give a center-to-center line distance of 10 μm (945 lines per centimeter, or 2400 lines per inch). An air stream was blown over the donor surface to remove the sublimed dye. The measured average total power at the focal plane was 130 mW. The Status A density of the dye layer before imaging is given in Table 1 and was approximately 3.0 and was compared to the residual density after writing a D-min patch at 150 rev./min and at 200 rev./min.

The D-max and D-min transmission data were obtained using an X-Rite densitometer Model 310 (X-Rite Co.) at the two exposures and are shown in Table 1 as follows.

TABLE 1

| Dye-Barrier Layer | D-max | D-min @ 827 mJ/cm$^2$ exposure | D-min @ 621 mJ/cm$^2$ exposure |
|---|---|---|---|
| C-1 (control) | 3.16 | .10 | .10 |
| 1A | 3.03 | .05 | .05 |
| 1B | 2.97 | .04 | .05 |
| 1C | 2.98 | .03 | .04 |

The above results indicate that in elements where a dye-barrier layer was employed, the D-min is significantly lower than that of the control without any dye-barrier layer.

EXAMPLE 2

A dye-barrier coverage series was run to determine if there is any impact of the dye-barrier layer thickness on D-min. The following layers were coated on an unsubbed 175 μm thick poly(ethylene terephthalate) support:

Element 2A a) an acrylamide polymer, Cyanamer P-21®, (American Cyanamid Co.) coated at 0.54 g/m$^2$ from water; and b) a neutral dye formulation containing 0.52 g/m$^2$ of RS 1139 sec cellulose nitrate (Aqualon Co.), 0.18 g/m$^2$ IR-1, 0.30 g/m$^2$ C-1, 0.15 g/m$^2$ C-2, 0.16 g/m$^2$ Y-1, and 0.26 g/m$^2$ M-1 from acetone.

Element 2B:

like 2A except layer a) was coated at 0.38 g/m$^2$.

Element 2C:

like 2A except layer a) was coated at 0.16 g/m$^2$.

Element 2D:

a) a layer of 96% hydrolyzed poly(vinyl alcohol) (Scientific Polymer Products, Inc.) coated at 0.54 g/m$^2$ from water; and b) a neutral dye formulation containing 0.66 g/m$^2$ of RS 1139 sec cellulose nitrate (Aqualon Co.), 0.23 g/m$^2$ IR-1, 0.38 g/m$^2$ C-1, 0.19 g/m$^2$ C-2, 0.20 g/m$^2$ Y-1, and 0.33 g/m$^2$ M-1 from acetone.

Element 2E:

like 2D except layer a) was coated at 0.38 g/m$^2$.

Element 2F:

like 2D except layer a) was coated at 0.16 g/m$^2$.

Control C-1 was the same as in Example 1. Control C-2 used the same dye formulation of 2D coated on the unsubbed support (no dye-barrier layer).

The elements were prepared and tested as in Example 1 with the following results:

TABLE 2

| Dye-Barrier Layer | D-max | D-min @ 827 mJ/cm$^2$ exposure | D-min @ 621 mJ/cm$^2$ exposure |
|---|---|---|---|
| C1 (control) | 3.16 | .10 | .10 |
| C2 (control) | 3.79 | .10 | .10 |
| 2A | 3.03 | .05 | .05 |
| 2B | 3.02 | .05 | .05 |
| 2C | 3.20 | .05 | .07 |
| 2D | 3.74 | .08 | .04 |
| 2E | 3.86 | .03 | .05 |
| 2F | 3.97 | .03 | .06 |

The above results indicate that the thickness of the barrier layer has little or no impact on the D-min that can be achieved.

EXAMPLE 3

This coating series was run to determine if there is any impact of the image dye formulation on D-min.

Monocolor sheets were prepared by coating 0.38 g/m$^2$ of poly(vinyl alcohol) from water on unsubbed 100 μm thick poly(ethylene terephthalate) support and overcoating with:

Element 3A:

a neutral dye formulation containing 0.38 g/m$^2$ of RS 1139 sec cellulose nitrate (Aqualon Co.), 0.23 g/m$^2$ IR-1, 0.38 g/m$^2$ C-1, 0.19 g/m$^2$ C-2, 0.20 g/m$^2$ Y-1, and 0.33 g/m$^2$ M-1 from acetone.

Element 3B:

a neutral dye formulation containing 0.59 g/m$^2$ of RS 1139 sec cellulose nitrate, 0.20 g/m$^2$ IR-1, 0.34 g/m$^2$ C-I, 0.18 g/m$^2$ Y-1, and 0.29 g/m$^2$ M-1 from acetone.

Element 3C:

a neutral dye formulation containing 0.42 g/m$^2$ of RS 1139 sec cellulose nitrate with 0.14 g/m$^2$ IR-1, 0.24 g/m$^2$ C-i, 0.12 g/m$^2$ C-2, 0.13 g/m$^2$ Y-1, and 0.21 g/m$^2$ M-1 from acetone.

Control C-3:

a neutral dye formulation (no dye-barrier layer) containing 0.42 g/m$^2$ of RS 1139 sec cellulose nitrate with 0.14 g/m$^2$ IR-1, 0.24 g/m$^2$ C-i, 0.12 g/m$^2$ C-2, 0.13 g/m$^2$ Y-1, and 0.21 g/m$^2$ M-1 from acetone.

Controls C-1 and C-2 were prepared according to Example 1.

The elements were prepared and tested as in Example 1 with the following results:

TABLE 3

| Dye-Barrier Layer | D-max | D-min @ 827 mJ/cm$^2$ exposure | D-min @ 621 mJ/cm$^2$ exposure |
|---|---|---|---|
| C-1 (control) | 3.16 | .10 | .10 |
| C-2 (control) | 3.79 | .10 | .10 |
| C-3 (control) | 2.14 | .13 | .09 |
| 3A | 3.86 | .03 | .05 |
| 3B | 3.42 | .04 | .05 |
| 3C | 2.42 | .03 | .03 |

The above results indicate that the image dye formulation has little or no impact on the D-min that can be achieved.

EXAMPLE 4

Other dye-barrier layers were coated to demonstrate that the dye-barrier layer must be hydrophilic to perform as a barrier. Monocolor sheets were prepared by coating the following barrier layers onto an unsubbed 100 μm poly(ethylene terephthalate) support:

Element 4A: Titanium tetra-n-propoxide Tyzor® TBT (DuPont Corp.) at 0.54 g/m$^2$ from n-butanol.

Element 4B: same as 4A except at 0.12 g/m$^2$.

Element 4C: gelatin at 0.12 g/m$^2$ from water.

Control C-4: poly(ethylene oxide) at 0.54 g/m$^2$ from water.

Control C-5: aqueous polyester ionomer AQ 55D® (Eastman Chemical Co.) at 0.54 g/m$^2$ from water.

Control C-6: poly(ethyl methacrylate-co-methacrylic acid) (60:40) at 0.54 g/m$^2$ with 0.01 g/m$^2$ Zonyl FSN® surfactant (DuPont Corp.) from ethanol.

Elements C-4, C-5, 4A, 4B, and 4C were overcoated with the neutral dye formula as in example 1. Control C-6 and control C-7 (no dye-barrier layer) were coated with the following neutral dye formulation: 0.48 g/m$^2$ RS 60 sec cellulose nitrate, 0.18 g/m$^2$ IR-1, 0.67 g/m$^2$ C-1, 0.16 g/m$^2$ Y-1, and 0.29 g/m$^2$ M-1 from acetone.

The elements were prepared and tested as in Example 1 with the following results:

TABLE 4

| Dye-Barrier Layer | D-max | D-min @ 827 mJ/cm$^2$ exposure | D-min @ 621 mJ/cm$^2$ exposure |
|---|---|---|---|
| C-4 | 3.04 | .16 | .22 |
| (Control) C-5 | 2.97 | .12 | .13 |
| (Control) C-6 | 2.94 | — | .20 |
| (Control) C-7 | 2.99 | — | .14 |
| (control) 4A | 2.92 | .08 | .07 |
| 4B | 2.99 | .09 | .09 |
| 4C | 2.94 | .07 | .06 |

The above data indicate that only hydrophilic dye-barrier layers are effective in reducing D-min.

The invention has been described in detail with particular reference to preferred embodiments thereof, but it will be understood that variations and modifications can be effected within the spirit and scope of the invention.

What is claimed is:

1. A process of forming a single color, dye ablation image having an improved D-min comprising imagewise heating by means of a laser, a dye-ablative recording element comprising a transparent support having thereon a dye layer comprising an image dye dispersed in a polymeric binder, said dye layer having an infrared-absorbing material associated therewith to absorb at a given wavelength of said laser used to expose said element, said image dye being substantially transparent in the infrared region of the electromagnetic spectrum and absorbs in the region of from about 300 to about 700 nm and does not have any substantial absorption at the wavelength of said laser used to expose said element, said laser exposure taking place through the dye side of said element, and removing the ablated image dye material to obtain said image in said dye-ablative recording element, wherein said element contains a substantially transparent, hydrophilic, organic or inorganic polymeric dye barrier layer between said support and said dye layer.

2. The process of claim 1 wherein said hydrophilic dye barrier layer comprises poly(vinyl alcohol).

3. The process of claim 1 wherein said hydrophilic dye barrier layer comprises gelatin.

4. The process of claim 1 wherein said hydrophilic dye barrier layer comprises an acrylamide polymer.

5. The process of claim 1 wherein said hydrophilic dye barrier layer comprises a titanium alkoxide.

6. The process of claim 1 wherein said hydrophilic dye barrier layer is present at a concentration of from about 0.01 to about 1.0 g/m$^2$.

7. The process of claim 1 wherein said infrared-absorbing material is contained in said dye layer.

8. The process of claim 1 wherein said infrared-absorbing material is a dye.

* * * * *